(12) United States Patent
DiStefano et al.

(10) Patent No.: US 6,465,747 B2
(45) Date of Patent: Oct. 15, 2002

(54) MICROELECTRONIC ASSEMBLIES HAVING SOLDER-WETTABLE PADS AND CONDUCTIVE ELEMENTS

(75) Inventors: Thomas H. DiStefano, Monte Sereno; Joseph Fjelstad, Sunnyvale, both of CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/951,046

(22) Filed: Sep. 13, 2001

(65) Prior Publication Data

US 2002/0029902 A1 Mar. 14, 2002

Related U.S. Application Data

(63) Continuation of application No. 09/047,638, filed on Mar. 25, 1998, now Pat. No. 6,324,754.

(51) Int. Cl.[7] .................................................. H01R 9/09
(52) U.S. Cl. ........................ 174/261; 174/260; 257/692; 257/779; 361/743
(58) Field of Search .............................. 174/261, 260; 257/779, 692; 361/772, 743; 228/180.21, 180.22; 29/837

(56) References Cited

U.S. PATENT DOCUMENTS

| | | | |
|---|---|---|---|
| 3,823,469 A | | 7/1974 | Hegarty et al. ................ 29/589 |
| 4,050,621 A | | 9/1977 | Bouley .................... 228/180 R |
| 4,604,644 A | * | 8/1986 | Beckham et al. ............ 257/779 |
| 4,605,153 A | | 8/1986 | Van Den Brekel et al. 228/56.3 |
| 4,803,450 A | * | 2/1989 | Burgess et al. ......... 228/180.22 |
| 4,837,609 A | * | 6/1989 | Gurvitch et al. ............... 257/43 |
| 5,060,844 A | | 10/1991 | Behun et al. ............. 228/180.2 |
| 5,133,495 A | | 7/1992 | Angulas et al. .......... 228/180.1 |

(List continued on next page.)

FOREIGN PATENT DOCUMENTS

| WO | WO 95/34106 | 12/1995 |
|---|---|---|
| WO | WO 97/44859 | 11/1997 |

OTHER PUBLICATIONS

Andros et al., TBGA Package Technology, IEEE Transactions on Components, Packaging and Manufacturing Technology, Part B. vol. 17, No. 4, Nov. 1994, pp. 564–568.

Publication, in American National Standard ANSI/IPC–D–249, "Design Standard for Flexible Single and Double Sided Printed Boards," Jan. 1997, p. 47.

Publication, in American National Standard ANSI/IPCD–275, "Design Standard for Rigid Printed Boards and Rigid Printed Board Assemblies," Sep. 1991, pp. 62–68.

Fjelstad, Joseph, Publication, An Engineer's Guide to Flexible Circuit Technology (Electrochemical Publication Limited 1997; ISBN 0901150347), pp. 148–149.

Publication, in Standard ANSI/IPC–D–350, Revision D, Jul. 1992, pp. 46–49.

IBM Technical Disclosure Bulletin, vol. 40, No. 6, pp. 199–200, "Ball Grid Array Solder Ball on Ball Grid Array Dimple Pad," Jun. 1997.

*Primary Examiner*—Albert W. Paladini
(74) *Attorney, Agent, or Firm*—Lerner, David, Littenberg, Krumholz & Mentlik, LLP

(57) ABSTRACT

A microelectronic assembly includes a component having one or more conductive pads, with each conductive pad having a plurality of solder-wettable strips extending outwardly away from a center, the solder wettable strips being bounded by non solder-wettable material. The microelectronic assembly also includes a composite conductive element positioned atop at least one of the conductive pads, the composite conductive element including a solid conductive core and a layer of solder material overlying the solid conductive core, the solid conductive core having a higher melting temperature than the layer of solder material.

32 Claims, 5 Drawing Sheets

U.S. PATENT DOCUMENTS

| | | | |
|---|---|---|---|
| 5,148,265 A | 9/1992 | Khandros et al. | 357/80 |
| 5,148,266 A | 9/1992 | Khandros et al. | 357/80 |
| 5,160,409 A | 11/1992 | Moore et al. | 156/656 |
| 5,400,220 A | 3/1995 | Swamy | 361/760 |
| 5,519,580 A | 5/1996 | Natarajan et al. | 361/760 |
| 5,534,127 A | 7/1996 | Sakai | 205/125 |
| 5,547,740 A | 8/1996 | Higdon | 429/209 |
| 5,551,627 A | 9/1996 | Leicht et al. | 228/180.22 |
| 5,558,271 A | 9/1996 | Rostoker et al. | 228/180.22 |
| 5,615,477 A * | 4/1997 | Sweitzer | 361/743 |
| 5,801,446 A | 9/1998 | DiStefano et al. | 257/778 |
| 5,808,874 A | 9/1998 | Smith | 361/769 |
| 5,849,750 A | 12/1998 | Sakemi et al. | 174/261 |
| 5,885,849 A | 3/1999 | DiStefano et al. | 438/108 |
| 6,130,448 A * | 10/2000 | Bauer et al. | 257/692 |

* cited by examiner

MICROELECTRONIC ASSEMBLIES HAVING SOLDER-WETTABLE PADS AND CONDUCTIVE ELEMENTS

CROSS-REFERENCE TO RELATED APPLICATIONS

The present application is a continuation of, and claims benefit of, U.S. application Ser. No. 09/047,638, filed Mar. 25, 1998, which is now U.S. Pat. No. 6,324,754.

BACKGROUND OF THE INVENTION

The present invention relates to microelectronic connection components and more specifically relates to microelectronic assemblies incorporating soldered connections and to components incorporating pads for soldering.

Soldered connections are used throughout the electronics industry to connect electronic components. Where the components to be connected include dielectric elements such as a rigid circuit panel or a flexible dielectric circuit panel with conductive metallic traces, the traces may be provided with enlarged regions, commonly referred to as "lands" or "pads". The traces may extend along a surface of the dielectric element. A further dielectric element, commonly referred to as a "solder mask" or "coverlay" may be provided. The solder mask layer may be applied by laminating a preformed dielectric sheet to the surface of the dielectric element, or by forming the dielectric sheet from a curable liquid on the surface of the dielectric element. The solder mask has holes at spacings corresponding to the spacings of the pads. The solder mask coverlay closely overlies the trace-bearing surface of the panel and closely overlies the metallic traces, leaving all or part of each pad exposed at the corresponding hole in the solder mask. A mass of solder may be deposited on each pad, either by exposing the assembly to a liquid solder, as in a wave soldering or dip soldering process or, more typically, by applying solder performs commonly referred to as "solder balls" onto the pads and heating the assembly to melt the solder. The molten solder wets the metal of the pads and forms a strong bond to the pads. The solder mask layer, which is not wettable by the solder confines the solder on the pads. In the absence of the solder mask layer, the molten solder could wet the metal in the traces extending away from the pads and hence could flow outwardly, along the traces. This would provide solder in undesired locations and displace the solder mass from its desired location, centered on the pad. Moreover the undesired solder flow can remove solder from the pads where it is required for forming the joints. The solder mask prevents this undesired flow.

After application of the solder masses, the component has solder masses protruding from the surface. A component such as a semiconductor chip package having an array of solder masses on a surface in a grid-like pattern is sometimes referred to as a "ball-grid array" element. The use of ball-grid arrays in packages for microelectronic devices such as semiconductor chips is described for example, in the article "TBGA Package Technology," IEEE Transactions on Components, Packaging and Manufacturing Technology, Part B, Vol. 17, No. 4, VP 564–568 by Andros and Hammer and in "Ball Grid Array Technology," Lau, J. H. ed, pp. 460–464. As described, for example, in commonly assigned U.S. Pat. Nos. 5,148,265 and 5,148,266, a microelectronic component such as a semiconductor chip may include a set of pads in the form of terminals which may be mounted on a dielectric layer such as a flexible sheet. The pads or terminals may be connected to contacts on the chip by flexible leads and may be supported above the surface of the chip by a compliant layer such as an elastomer interposed between the terminals and the chip, typically between the dielectric layer and the chip. Masses of solder may be provided on the pads or terminals for connecting the assembly to a circuit board or other substrate having corresponding pads.

The component can be engaged with another component having a corresponding set of pads and, typically, also having similar solder mask. After engaging the protruding solder masses with the pads of the other component, the solder masses may be heated again to melt all or part of each solder mask and bond the solder masses to the pads of the other component. The resulting solder columns interconnect pads on both components with one another electronically and also form a mechanical connection between the components. In a variant of this process, each solder ball may include a core, typically formed from a conductive metal such as copper or nickel which does not melt at the temperatures used to melt the solder. Such a core is commonly referred to as a "solid core". A "solid" core in this context may have one or more interior voids, or else may be entirely free of voids. The resulting solder joint includes the solid core embedded within an outer layer of solder. Alternatively, the protruding solder elements may be engaged with a small socket having holes and metallic resilient elements designed to accept and engage the solder elements in the holes. Sockets of this type are disclosed in certain embodiments of International Patent Publication WO 95/34106. Other sockets which can engage protruding solder or other elements are described in International Patent Publication WO 97/44859.

One particularly useful approach described in copending commonly assigned in U.S. patent application Ser. No. 411,472 filed Mar. 28, 1995 incorporates solid core solder assemblies in components with having pads supported on a compliant layer. In certain structures according to the '472 application, the compliant layer allows the pads and hence the solid core solder assemblies to move when the component with the assemblies thereon is juxtaposed with another component. This allows the solid core solder assemblies to engage the pads on the opposite component despite some minor deviations from perfect planarity of the pads on the components. Moreover, the compliant layer in the assembly mechanically decouples the pads from movement of the underlying component caused by thermal expansion and contraction and thus reduces the mechanical stresses, such as fatigue on the solder assemblies. The mechanical decoupling also facilitates use of the component with a socket adapted to receive the solid core solder balls.

Some typical configurations for pads or lands are described for example in American National Standard ANSI/IPC-D-249, Design Standard for Flexible Single and Double Sided Printed Boards; in American National Standard ANSI/IPCD-275 of September 1991 entitled Design Standard for Rigid Printed Boards and Rigid Printed Board Assemblies, pp.62–68; in Design Guidelines for Surface Mount and Fine—Pitch Technology, 2nd edition, 1996 by Vernon Solberg, pp.142–143; and in Fjelstad, An Engineer's Guide to Flexible Circuit Technology (ElectroChemical Publications Limited 1997; ISBN 0901150347), pp.148–149.

Many common pads are round, circular bodies of conductive material. However, other shapes, such as hollow circles or squares of conductive material have been employed. Also, round and square lands with branches or ribs extending from them have been employed as illustrated in Standard ANSI/IPC-D-350, Revision D, July 1992 and in Natarajan et al., U.S. Pat. No. 5,519,580. Still other solder land configurations are disclosed in IBM Technical Disclosure Bulletin, Vol. 40, No. 6, pp.199–200 entitled "Ball Grid Array Solder Ball on Ball Grid Array Dimple Pad" (June 1997); in U.S. Pat. No. 5,400,220 and in U.S. Pat. No. 5,133,495.

Despite all of these efforts in the art however, further needs for improvement in microelectronic assemblies incorporating solder joints, and in method components for making such joints, remain.

SUMMARY OF THE INVENTION

One aspect of the present invention provides methods of fabricating microelectronic assemblies. A method in accordance with this aspect of the invention desirably includes the steps of providing a component including a base and one or more pads on a base. Each pad includes a plurality of line segments or strips of solder-wettable material such as a metal extending outwardly away from a center, the lines of solder-wettable material being bounded by non-solder wettable material which may be metallic or non-metallic. The method further includes the steps of providing a mass of a molten solder and a solid core on at least some the pads so that at each pad where the mass and core are provided, the molten solder contacts the core and also contacts the wettable lines of the solder pad and then cooling the solder, cores and pads to solidify the solder.

Methods according to this aspect of the invention incorporate the realization that pads having outwardly extending wettable strips provide certain unique benefits when used with solid core solder balls. In particular, the assembly which results when a solid core solder ball is reflowed on such a pad tends to have the solid core in the desired position, resting directly on the pad with little or no solder intervening between the core and the pad, and with the core well centered on the pad. Although the present invention is not limited by any theory of operation, it is believed that this action results from the patterns of a surface tension which arise when the wettable lines are provided. Regardless of the reasons for this phenomenon, provision of the solid core in the desired positions provides several benefits. First, non-uniformities in the height of the solid core solder balls caused by differences position of the core are minimized. This, in turn, facilitates engagement of the component having the solid core solder balls with pads or sockets on a mating component. Also, the enhanced centering of the cores provides solid core solder balls at predictable, horizontal locations corresponding to the horizontal locations of the pad centers on the base. For example, where the pads are disposed at a uniform center-to-center spacing or "pitch", the solid core solder balls will also be at a uniform pitch. This in turn facilitates engagement of the solid core solder balls in multiple sockets of a socket element or engagement of the solid core solder balls with pads on an opposing component.

Moreover, placement of the cores at the preferred location touching the pad or very close to the pad minimizes the amount of solder disposed between the core and the pad. This, in turn, leaves more of the solder free to form generous fillets surrounding the juncture of the solder ball and the pad. This in turn enhances the assembly to resist fatigue stress. Also, the outwardly extending strips provide locally enlarged fillets at the various locations around the periphery of the joint between the solder ball and the pad, thereby further reinforcing the structure against mechanical stress. In particularly preferred arrangements, the cores project horizontally over the lines. For example, the cores may be spherical and the strips of solder-wettable material of each pad may extend radially inwardly so that the inner ends of the lines lie at a distance from the center of the pad which is smaller than the radius of the core associated with the pad.

Each pad desirably includes at least three lines of solder wettable material. Each pad may also include a central body, so that the strips join the central body and project outwardly from the central body. Alternatively, the pad may consist entirely of the strips. The strips may extend all the way inwardly to intersect one another at the center of the pad, or may stop at a small distance from the center so that the strips do not intersect one another.

Additional methods according to this aspect of the invention may include the step of further assembling the component to other elements. For example, the solid core solder balls projecting from the pads may be engaged in sockets of a multi-socket element. Alternately, the component with the solid core solder balls thereon may be juxtaposed with a substrate having additional pads thereon. Such engagement may be performed during the original step of providing the mass of molten solder and the solid core, so that the pads on the substrate are engaged with the molten solder before the solder first cools to bond the molten solder and the solid core to the pads of the component. Alternately, the component may be provided with the cooled and bonded solid core solder balls and then may be juxtaposed with the substrate having mating pads thereon and reheated to form bonds with the mating pads. In either case, the mating pads on the substrate may also include lines of solder-wettable material as aforesaid.

Methods according to further aspects of the invention include the steps of providing a component incorporating a base and one or more pads on the base, each such pad having a surface with a solder wettable area and a non-solder wettable area. Methods according to this aspect of the invention further include the steps of providing a mass of molten solder on each pad so that the molten solder on each pad to the wettable area of the pad surface and is wholly or partially confined by the non-wettable area of the pad surface and then cooling the pads and solder to solidify the solder. The non-wettable areas desirably act to prevent spreading of the solder as, for example, to prevent solder from spreading from the pad along a trace intersecting the pad. The non-wettable areas may include one or more non-wettable regions adjacent the periphery of the pad. For example, the non-wettable areas may include non-wettable areas at an intersection of the pad and a trace may also include a loop-like border of non-wettable surface encircling the wettable areas. In methods according to these embodiments of the invention, the non-wettable areas of the pads themselves provide solder confinement. Therefore, a separate solder mask is not required for confinement of the molten solder. Omission of the solder mask can provide significant savings in costs and complexity of the assembly. Moreover, there is no need to provide a solder mask in precise registration with the pads. This is of particular significance in assemblies incorporating small pads. In assemblies which include solder masks for confinement of the solder, misregistration with the solder mask and the pads effectively reduces the area of the pad available for solder bonding and can result in a bond having an undesirable shape susceptible to fatigue stresses in service. This possibility is effectively eliminated in preferred methods according to this aspect of the present invention. Even if a separate solder mask is used, the solder mask may have holes substantially larger than the pads, so that misregistration will not result in coverage of any of the pad by the solder mask.

In further methods according to this aspect of the invention, the wettable areas on the pads may incorporate a plurality of lines extending generally radially with respect to the center of each pad. Pads defining such lines may be used in conjunction with solid core solder balls to provide the benefits discussed above in connection with solid core solder ball joints, and can also be used in conjunction with other solder masses.

Still further aspects of the present invention provide components for forming solder connections. These components include a base and a plurality of pads on the base. Each pad includes a conductive, preferably metallic element having a top surface facing away the base. The pad has wettable and non-wettable surface areas on the top surface of the conductive element. The wettable area may include, for example, a plurality of lines extending radially with respect to the center of the pad. Alternatively or additionally, each pad may include a non-wettable area effective to confine solder on the wettable area as, for example, one or more non-wettable areas at a juncture of the pad and a trace or other metallic feature or a non-wettable area in a loop-like configuration encircling the wettable area, or both. The wettable area typically is defined by exposed region of the metallic element as, for example, exposed copper, gold or other pure metal. The non-wettable area may have a non-wettable pure metal or metal alloy at its surface as, for example, one or more metals selected from the group consisting of nickel, chromium, rhodium, osmium, and combinations thereof. Alternatively or additionally, the non-wettable area may include a metal compound such as an oxide or nitride of a metal. According to a further variant, the non-wettable areas of the pads may be provided by dielectric materials such as polymers selectively deposited on the pads by an electrophoretic or other process. Components according to this aspect of the invention and may be used in a process as discussed above.

These and other objects, features and advantages of the present invention will be more readily apparent from the detailed description of the preferred embodiment, taken in conjunction with the accompanying drawings.

DETAILED DESCRIPTION OF THE PREFERRED EMBODIMENTS

Figure 1:
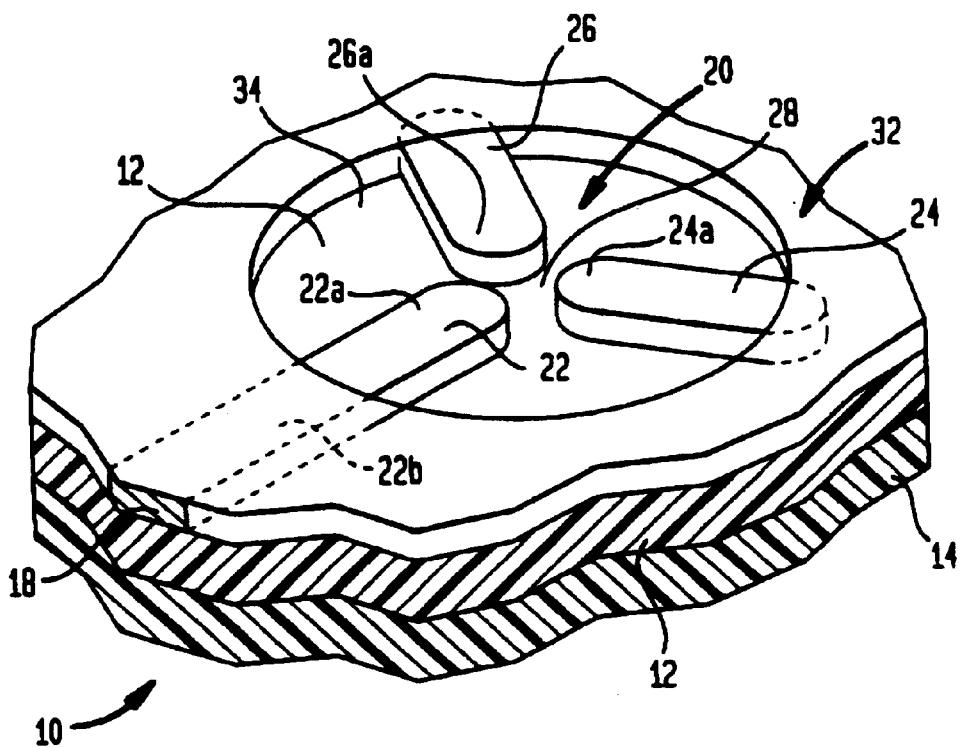
FIG. 1 is a fragmentary diagrammatic perspective view depicting a portion of a component in accordance with one embodiment of the invention.
Figure 2:
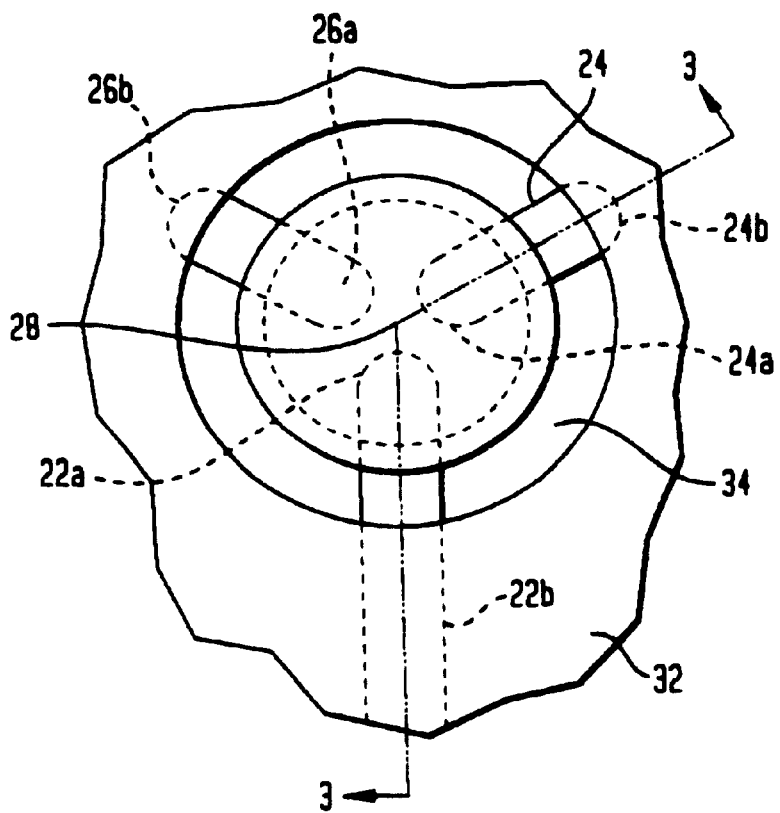
FIG. 2 is a fragmentary top plan view of an assembly incorporating the component of FIG. 1 in conjunction with a solid core solder ball.
Figure 3:
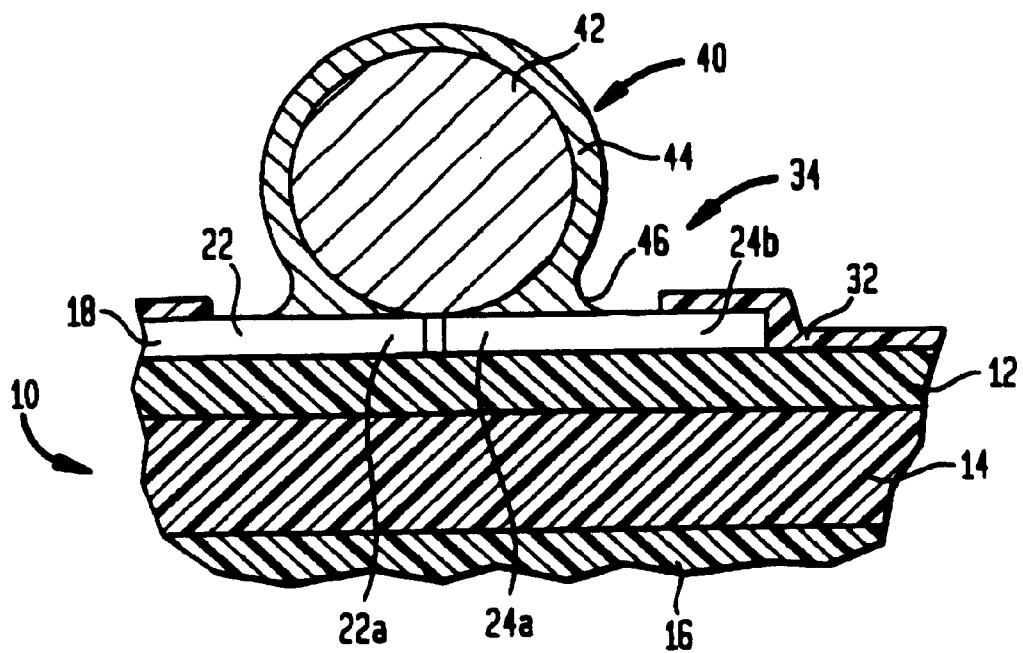
FIG. 3 is a diagrammatic sectional elevational view taken along line 3—3 in FIG. 2.
Figure 4:
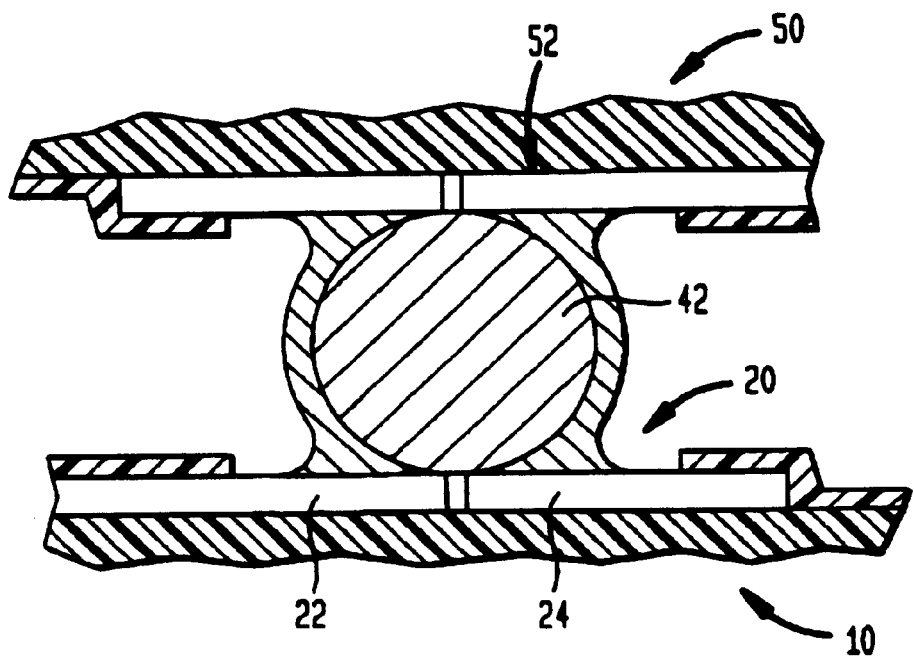
FIG. 4 is a view similar to FIG. 3 but depicting an assembly incorporating the assembly of FIG. 3 in conjunction with an additional component.

A component in accordance with one embodiment of the invention includes a base 10 incorporating a top dielectric layer 12 formed from a conventional dielectric material such as a polyimide or other polymer, glass or ceramic. The particular base 10 illustrated in FIGS. 1–5 has a top dielectric layer 12 in the form of a flexible polymeric sheet, and includes a compliant layer 14 formed from a material such as a foam, gel or elastomer beneath top dielectric layer 12. Compliant layer 14 in turn overlies a microelectronic element 16 such as a semiconductor chip, semiconductor wafer or a microelectronic connecting substrate such as a circuit panel. A large number of metallic conductive traces 18 extend along the outwardly facing or exposed surface of top dielectric layer 12, i.e., along the surface of the dielectric layer remote from compliant layer 14 and from the underlying microelectronic element 16. Some or all of the traces 18 may be connected to the microelectronic element 16 by flexible leads integral with the traces or attached thereto. Alternatively or additionally, the traces may be interconnected with one another within the component.

Figure 5:
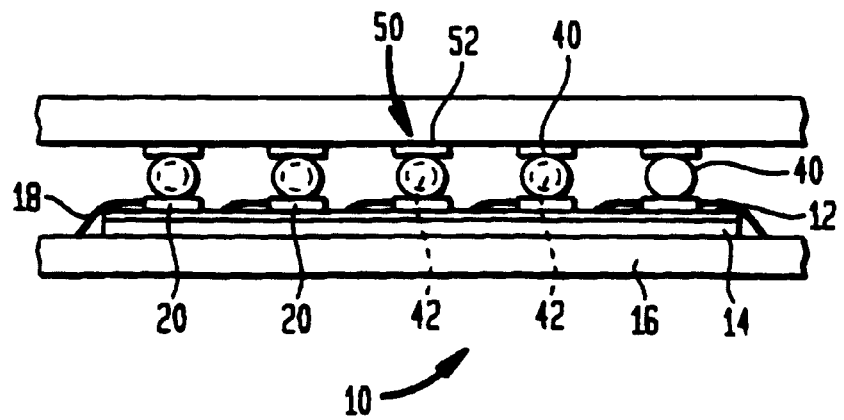
FIG. 5 is a diagrammatic elevational view depicting the assembly of FIG. 4.

A plurality of pads 20 are provided at spaced apart locations in a regular grid pattern on the upper or exposed surface of the top dielectric layer 12. Only one pad is visible in each of FIGS. 1–4, whereas only a few are shown in FIG. 5. In actual practice, the component may include any number of pads. Each pad includes three generally elongated metallic line segments or strips 22, 24, 26 extending generally radially outwardly away from a common center point 28 on the exposed upper surface of dielectric layer 12. The inner ends 22a, 24a, 26a of the strips constituting each pad (the ends closest to the center 28) are spaced slightly from the center and from one another so that the strips constituting each pad are not contiguous with one another. The outer end 22b of the first strip 22 in each pad is continuous with a trace 18. The outer most ends of one or more of the other strips may also be continuous with traces so that a single pad may be connected to two or more of the traces. A dielectric solder mask layer 32 overlies the upper dielectric layer 12 and the traces. Solder mask layer 32 has holes 34 at each pad. Each hole 34 is generally circular and is at least approximately concentric with the centers of the pads. The size of the holes 34 is selected so that the outer ends 22b, 24b, 26b of the strips or line segments 22, 24, 26 are engaged beneath the solder mask.

The pads 20 may be provided at any desired center-to-center distance or pitch on the surface of the base. However, pads in accordance with the invention are especially useful where the pads are disposed at a relatively fine pitch, typically less than about 1 mm more preferably less than about 0.75 mm and most preferably about 0.5 mm or less. The widths of the linear segments or strips 22, 24, 26 typically are less than about 200 $\mu$m and more typically less than about 100 $\mu$m. The strips and traces may be formed from any suitable material which is both electrically conductive and wettable by the solder to be used in the process. As used in this disclosure, the term "solder-wettable" refers to a material which can be wet by the solder used in connection with that element. In those cases where a determination as to whether or not a material is solder-wettable must be made in the absence of any particular solder specification, the determination should be based upon whether or not the material will be wet by a conventional 90% lead, 10% tin solder. Numerous solder-wettable materials, most commonly metals are well-known in the art. These include copper, gold and alloys and combinations thereof. It is not essential that the entirety of each strip 22, 24, 26 be solder wettable. Some or all of the strips may include a core of a material which is not solder wettable and a solder wettable material may be present only at the surfaces of the strips as, for example, where a solder wettable material is plated over a non-solder wettable material. The pads can be fabricated using any of the processes normally used for providing metallic features on a dielectric layer in a microelectronic element. Such processes include provision of a continuous layer or spots of metal on the dielectric layer followed by subtractive etching using a photographically or otherwise patterned resist overlying the metal. Other processes include evaporative deposition, chemical vapor deposition, electroless plating and electroplating. Conventional masking procedures may be used to provide metal deposition only in selected areas.

The solder mask layer 32 may be formed from any of the conventional polymeric materials commonly used for this purpose, and may include an adhesive. The solder mask may be deposited on the surface of the base dielectric layer 12, and on the traces by a printing process such as by silk screening, by applying and selectively curing a flowable material, or, more typically, by forming a separate layer with the holes 32 thereon and laminating the solder mask layer onto the exposed surface of the dielectric element.

The component is assembled with a plurality of solid core solder balls 40. Each solder ball 40 includes a core 42 having a solder-wettable surface and a solder 44 overlying the core. The cores 42 may be hollow or, preferably, solid bodies formed from a solder-wettable material such as copper. Alternatively, each core 42 may be a solid or hollow composite structure including a plurality of materials with a solder-wettable material defining the exterior surface of the core. The solder balls typically are less than about 0.64 mm in diameter as measured prior to assembly of the solder ball to the component, more typically less than about 0.5 mm in diameter and, most preferably, less than about 0.38 mm (0.015 inches) in diameter. The cores have diameters somewhat smaller than the solder ball as a whole. Thus, each solder ball contains only a relatively small amount of solder coating the exterior of the core. The solder balls may be applied to the pads by any conventional process. Typically, a flux is applied to the pads along with the solder balls. For example, the flux may be stenciled onto the pads and the solder balls may be applied to the pads by holding a mask (not shown) with holes in registration with the pads over the component and sweeping a large number of solder balls across the mask so that solder balls drop into the holes. One particularly useful method of applying solder balls is disclosed in copending, commonly assigned U.S. Provisional Patent Application 60/048,178 filed May 30, 1997 of Joseph Link entitled "Spacer Plate Solder Ball Placement Fixture," the disclosure of which is hereby incorporated by reference herein. As disclosed in the '178 application, the mask may be spaced from the component so as to keep the mask free of flux.

After the solder balls are applied, the component, with the solder balls thereon is heated so as to melt or "reflow" the solder. This action provides a mass of molten solder with a core 42 disclosed therein on each contact. The molten solder wets the line segments or elongated strips 22, 24, 26 constituting each contact. While the solder is in a molten condition, the solder balls tend to reach the configuration shown in FIGS. 2 and 3. Thus, the core of each solid core solder ball tends to move towards the center 28 of an associated pad. Also, the core tends to settle into engagement with the metallic elements 22, 24, 26 of the pad. Stated another way, the cores 42 do not float upwardly within the mass of molten solder. Although the present is not limited by any theory of operation, it is believed that these effects are caused, at least in part, by surface tension forces between the solder and the wettable material of strips or line segments as well as by surface tension at the surface of the solder mass itself.

The dimensions of cores and pads are selected so that the radius $R_c$ of each core is greater than the distance from the center point 28 of the pad to the inner end 24a, 24b, 24c of each strip 22, 24, 26. Thus, with the core centered or nearly centered on the pad, the inner ends 22a, 24a, 26a of the conductive strips or line segments extend beneath the core. The molten solder forms fillets 46 around the juncture of the solder ball and the pad. It should be appreciated that the depiction in the drawings is idealized. Also, the fillets will have differing radii and shapes at various locations around the center of the pad. Some solder may form a further fillet between the inner ends of the conductive lines.

The molten solder may tend to spread lengthwise along each of the conductive, solder wettable strips or line segments 22, 24 and 26. Such outward spread is arrested either by surface tension effects or by the solder mask 32 if the outward spread reaches the edge of a hole 34. After the molten solder has been allowed to wet the pads in this fashion, the assembly may be cooled to solidify the solder, leaving the solid core solder balls 40 protruding from the surface of base 10 as "bumps" having a configuration shown in FIG. 3. The assembly may be washed to remove flux. The small spaces between the lines facilitate complete removal of flux.

After cooling, the device may be reheated to again melt the solder in the solder balls and the device, with the bumps thereon, may be engaged with a further component, referred to herein as a "substrate" 50 (FIGS. 4 and 5) having pads 52 supposed on a surface at locations corresponding to the locations of pad 20 on the first-mentioned component 10. This step may also be performed immediately after the solder balls are first brought molten condition or reflowed, without first cooling the solder to solidify the bumps. The pads 52 of substrate 50 may be similar to the pads 20 discussed above, or else may be of conventional configuration.

Engagement of the solid core solder balls with the pads 52 of the second component is facilitated by the precise positioning of the solder masses. Thus, each solder mass, and hence each solid core 42 is well centered in horizontal directions, such as the directions to the left and the right as seen in the drawings, parallel to the plane of the base surface. This relatively precise centering adds in registering the solder masses with the pads of the opposing element. Also, because the solid cores do not tend to "float", they are precisely positioned in the vertical direction, with each solid core close to the surface of the corresponding pad. Such precise vertical positioning facilitates simultaneous or nearly simultaneous engagement of all of the solder balls 40 with all of the contacts 52 on the opposing element and minimizes the degree to which the solder balls must be displaced vertically during the engagement process. As discussed at length in the aforementioned 08/411,472 application, compliant layer 14 and the flexible nature of the dielectric top layer 12 allow vertical movement of individual pads 20. This further facilitates engagement of numerous solder balls with numerous pads simultaneously. In this regard, the effects of more precise vertical positioning and vertical movability of individual pads complement one another. Thus, more precise vertical positioning of the solder balls, and particularly of the solid cores 40, reduces the need for vertical displacement of individual solder balls and individual solid cores, whereas the compliant layer makes it easier to accommodate such displacement.

In service, differential thermal expansion of the components will tend to move pads 52 relative to pads 20 and thus will apply stresses on the solder connections. However, because the solder balls are well-centered on the pads and because the solid cores are disposed in close engagement with the pads, with little or no solder intervening between the solid cores 42 and metal strips 22, the solder connections will have good resistance to fatigue stress. The fillet configuration formed according to this embodiment of the invention also contributes to fatigue stress resistance. The effects of the particular solder pad configuration and the resulting solder joint configuration are enhanced by mechanical decoupling between pads 20 and the underlying component 16. Such mechanical decoupling reduces the magnitude of fatigue stresses. The compliant layer 14 contributes to such mechanical decoupling.

Figure 6:
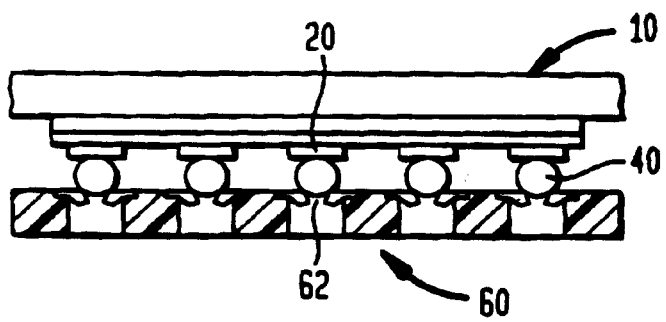
FIG. 6 is a diagrammatic, partially sectional elevational view depicting an assembly in accordance with a further embodiment of the invention.

The arrangement discussed above can be varied in numerous ways. For example, the component 10 with solid core solder balls or bumps 40 thereon may be engaged in a socket element 60 (FIG. 6) having numerous individual sockets 62 disposed at locations corresponding to the locations of the pads. Suitable sockets are disclosed, for example, in commonly assigned PCT International Publications WO 95/34106 and WO 97/44859, the disclosures of which are incorporated by reference herein. Such engagement may be performed with or without melting or reflowing the solder in the solder balls and may be performed either to form a permanent connection or as a test, temporary connection. The precise horizontal positioning of the solid core solder balls 40 with respect to contacts 20 greatly facilitates registration of the solder balls with the sockets 62 of the socket element and greatly facilitates simultaneous engagement of the solder balls in the sockets. The precise vertical positioning of the solder balls also facilitates engagement of the solder balls with the numerous sockets of the socket element 60.

Figure 7:
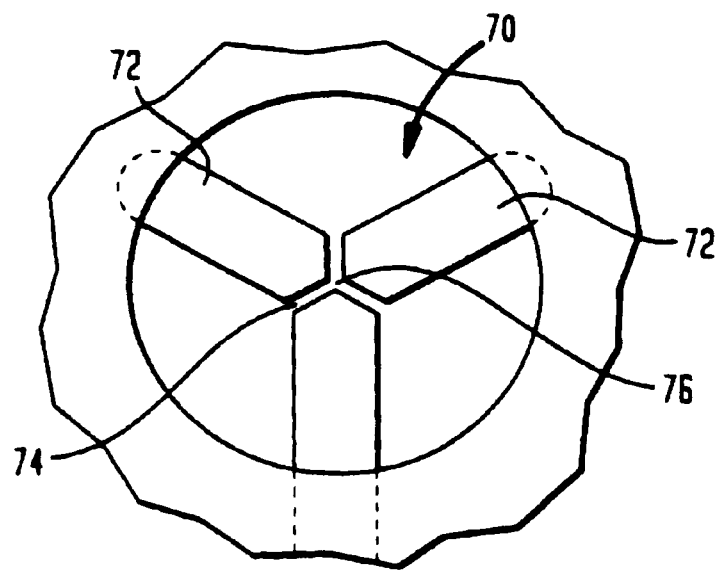
FIG. 7 is a fragmentary diagrammatic plan view depicting a portion of a component in accordance with a further embodiment of the invention.
Figure 8:
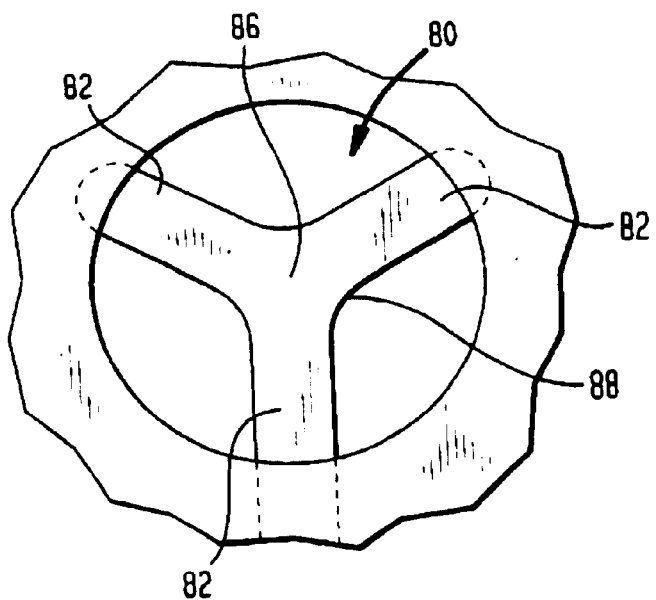
FIG. 8 is a view similar to FIG. 7 but depicting a component according to yet another embodiment of the invention.
Figure 9:
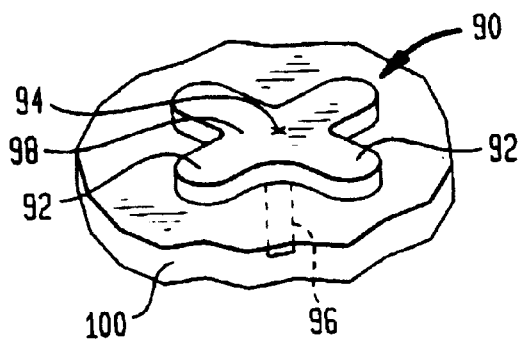
FIG. 9 is a fragmentary diagrammatic perspective view depicting a component in accordance with yet another embodiment of the invention.

The features discussed above can be varied. For example, a pad 70 (FIG. 7) has elongated strips or line segments 72 formed from conductive material as discussed above, except that the inner ends of the line segments have a generally triangular configuration so that the inner ends of line segments define a set of small channels 74 of substantially uniform width extending outwardly from the center of point 76 of the pad. The gaps or channels at the inner ends, with non-solder wettable dielectric material exposed in the channels, enhance the action of the pad in keeping the solid core at the correct position. A further pad 80 (FIG. 8) has strips or line segments 82 which join one another and merge smoothly with one another so that there is no gap at the center point 86. The line segments are provided with fillets or radii 88 at the junctures of their edges. Pads can be made with more than three line segments. Thus, the pad 90 of FIG. 9 has four line segments 92 projecting at generally radially outwardly from the center point 94 of the pad. Also, the pad 92 does not join with a trace running along the surface of the dielectric body. Instead, pad 92 is integral with a metallic via 96 extending downwardly from the surface of the dielectric layer into the base 100. Via 96 may extend all the way through the base to join with a conductive feature such as a pad, trace or potential plane on the opposite surface of the dielectric member. Alternatively, via 96 may extend only partially through the base and may join with a conductive feature such as a trace or potential plane element disposed within the base itself.

In the embodiments discussed above, the conductive line segments or strips extend substantially in a plane. However, in the embodiment of FIG. 9, the surface of the pad curves downwardly, in a vertical direction, adjacent the center point 94. Thus, the inner portions of the line segments 92 and the central portion 98 curve downwardly, into the base 100 adjacent the center point 94 of the pad. The central portion 98 of the pad may be cup-shaped, i.e., the central portion of the pad may be in the form of a surface of revolution about a vertical axis passing through the center point 98, with the center of such surface being lower than the edges. Such a vertically shaped pad may be formed by plating onto a dielectric member having through holes with outwardly flaring rims at the surface. For example, techniques for making outwardly flaring vias for use as contacts rather than as a solder pads are disposed in commonly assigned International Publication WO 96/02959, the disclosure of which is incorporated by reference herein.

Figure 10:
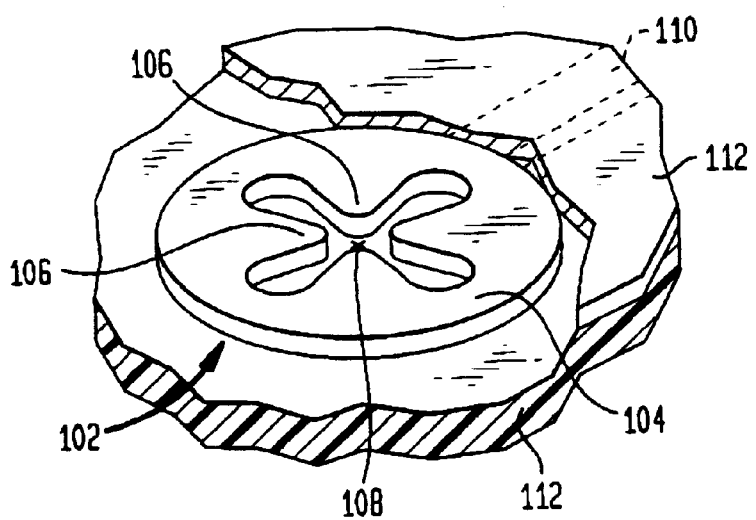
FIGS. 10, 11, 12 and 13 are views similar to FIG. 9 but depicting portions of components in accordance with different embodiments of the invention.

A pad 102 according to a further embodiment of the invention (FIG. 10) includes a unitary ring-like element 104 with line segments or strips 106 projecting radially inwardly from the ring-like element towards the center point 108 of the pad. The ring-like element is joined to a trace 110 on the surface of the dielectric element 112. A solder mask, partially removed for clarity of illustration in FIG. 10 overlies trace 110 but leaves at least part of the pad adjacent center point 108. Thus, at least the inner ends of line segments 106 are exposed. The outer ends of the line segments and the inner edge of ring-like element 104 also may be exposed. The dimensions of the solid core solder balls used with the pad are selected so that the diameter of the core is substantially larger than the distance between opposing inner ends of strips or line segments 106. However, the dimensions of the core and the amount of solder desirably are selected so that the solder does not form a continuous meniscus around the ring-like portion 104 during reflow. For example, the entire solid core solder ball may be a diameter slightly smaller than the inner diameter of ring-like portion 104. Alternatively, the holes in solder mask 112 can be dimensioned so that the inner edges of the holes in the solder mask lie over the outer ends of strips or line segments 106 and radially inwardly from the ring-like structure 104.

Figure 11:
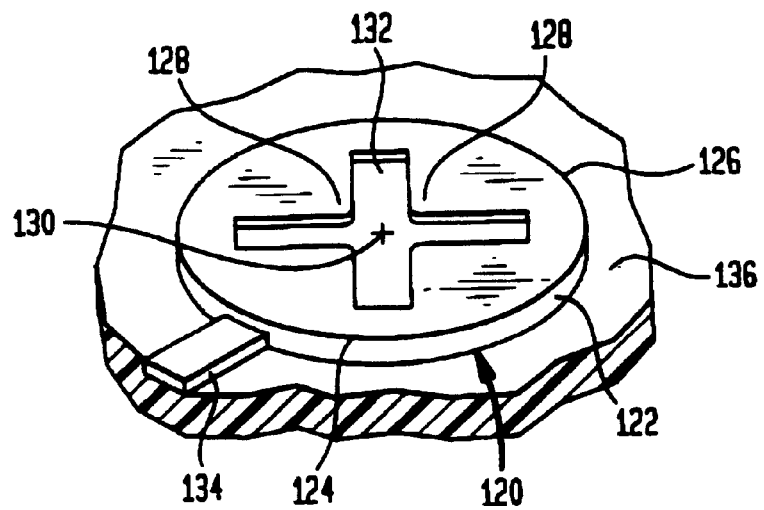

In the embodiments discussed above with reference to FIGS. 1–10, the metallic elements of the pad have solder wettable surfaces. The dielectric support structure and solder mask layer define non-wettable surfaces. As shown in FIG. 11, however, the pad itself may define both wettable and non-wettable surfaces. Thus, a pad 120 includes a solid disk 122 of a metal. A thin layer of 124 of a non-solder wettable metal compound such as a metal oxide, metal nitride or a non-solder wettable metal such as nickel or chromium overlies a part of the exposed top surface of metal layer 122. The non-wettable layer is provided in a loop-like circular barrier region 126 extending around the entire periphery of the pad and a set of projections 128 extending radially inwardly towards the center point 130 of the pad. The remaining exposed surface of layer 122 is solder wettable and provides a set of solder wettable line segments or strips 132 extending outwardly from the center point 130 of the pad. Each solder wettable line is bordered by two of the non-wettable regions 128 on its sides and by the ring-like non-wettable region 126 at the outer end of the line segment remote from the center point 130. The wettable line segments or strips join one another to provide a solder wettable region at center point 130. The pad illustrated in FIG. 11 operates in essentially the same manner as the pads discussed above with reference to FIGS. 1–10. Here again, the molten soldered wets line segments or strips 132 and does not wet the intervening non-wettable region 128. This action tends to center the mass of molten solder. The solder mass may be a solid core solder ball incorporating a solid core as discussed above. In the same manner as discussed above, the action of the molten solder tends to center the solid core and also tends to pull the core downwardly, so that the core does not float on the molten solder. Thus, after solidification, the core is positioned in engagement with the pad or very close to the pad in the same manner as discussed above.

The non-wettable areas integrated in the pad itself also effectively confine the solder. For example, a trace 134 is formed integrally with the metal layer 122 the non-wettable regions, including the ring-like and non-wettable region 126 confine the solder so that the solder cannot spread off of the pad onto trace 134 or onto adjacent metallic features. Accordingly, there is no need for a separate solder mask layer.

The metallic bodies 122 of the pads can be fabricated by known techniques, including the standard additive and subtractive techniques discussed above. The non-wettable surface regions can be formed on the surface of the metallic pad by depositing the non-wettable metals onto the pad using any conventional selective deposition technique, as, for example, electroplating or electroless plating using a resistor to protect the areas which are to remain wettable are followed by removal of the resistor. Other deposition processes such as sputtering, chemical vapor deposition and evaporation can also be employed. Where a technique other than electroplating is employed, a resist may be applied on these surrounding surface 136 of the base so as to avoid depositing metal on the base.

Alternatively, the entire surface of the metal pad 122 may be rendered non-wettable as, for example, by forming the entire pad from a non-wettable metal or, preferably, by non-selectively applying a thin layer of a non-wettable material such as nickel, chromium or combinations thereof onto a normally wettable metal pad such as a copper pad. A solder wettable material such as gold, tin, copper or combinations thereof is then selectively applied onto the non-wettable surface in only those regions which are to form the wettable line segments or strips 132. Here again, essentially any selective deposition process such as electroplating or electroless plating using a lithographically patterned resist may be employed. In a variant of this process, a wettable metal layer 122 may be covered with a non-wettable metal over its entire surface and then selectively etched to remove the non-wettable metal and leave a wettable surface only in the areas where a wettable surface is desired, leaving the non-wettable surface in the other areas.

Where the non-wettable surface includes a metal compound, the compound can be formed by selective oxidation or nitridation as, for example, by masking the areas where a wettable surface is desired and exposing the areas where a non-wettable surface is desired to, a plasma containing oxygen, nitrogen or a combination thereof. Alternatively, a metal compound can be formed on the desired regions by selective anodization. Processes of oxidation, nitridation and anodization, and other suitable processes for forming metal compounds on selected regions of a metal article are well known in the art. Any such known process can be employed.

The foregoing methods form non-wettable surfaces integral with the metallic elements of the pad itself. As used in this disclosure, a reference to a non-wettable surface which is integral with a metallic element should be taken as indicating that the non-wettable surface is unified with the underlying metallic element, as, for example, where the non-wettable surface is defined by the metal element itself; by a layer of metal connected to the underlying metallic element through one intimate metallurgical bond or through a series of such bonds involving one or more intermediate metallic layers, with all the interfaces between layers being intimate, metallurgical bonds. The term integral also includes layers of a metal compound which are compounds formed directly from the underlying metal or from one or more metal layers connected to the underlying metal by directly or by intermediate metallurgical bonds as discussed above.

In a further variant, the non-wettable layer may be provided as a coating on the pad which, although not integral with the metallic element nonetheless forms part of the pad itself. For example, such a coating may be applied by an electrophoretic deposition process. In an electrophoretic deposition process, the pads are connected to a source of electrical potential and are immersed in a bath of a liquid deposition mixture along with a counter electrode. A potential applied between the counter electrode and the pads causes solid material from the deposition mixture to deposit onto the surfaces of the pads. The pads are masked by a photoresist or other selectively patterned resistor prior to immersion in the position mixture, so that the coating is only applied in the regions which are not masked by the resist. To facilitate application of the electrical potential, the pads may be continuous with a metallic layer (not shown) which is subsequently removed from the part. Electrophoretic deposition processes and materials for use in deposition mixtures are well known in the coating arts. For example, materials for applying an acrylic polymer are sold under the designation Powercron cationic acrylic (900—900 series) by the PPG Company. Materials for applying epoxy coating are sold under the designation Powercron cationic epoxy (400–600 series) by the same vendor. Typically, the counter electrode is larger than the area to be covered by the coating and the current density during the electrophoretic deposition step desirably is maintained below about 1 milliampere per centimeter of coated area so as to minimize formation of defects in the deposited coating. The current may be substantially constant during the process. The applied potential may be on the order of about 100 volts and typically is applied for a few minutes or more. After the electrophoretic deposition step, the part is removed from the deposition bath, washed to remove cleaning undeposited deposition solution and then baked to cure the coating to a solid form. Other processes for depositing a dielectric coating may be employed as, for example, dipping or spraying in a curable coating material such as an epoxy, urethane, lacquer or plastisol to form an adherent liquid film and then curing the film to form a solid dielectric coating on the surfaces of the pads. Here again, the pads desirably are masked so that only a portion of each pad is covered by the coating. Vapor deposition and plasma polymerization processes may also be employed. It is desirable to apply the coating in as close to a uniform thickness as is practicable.

Figure 12:
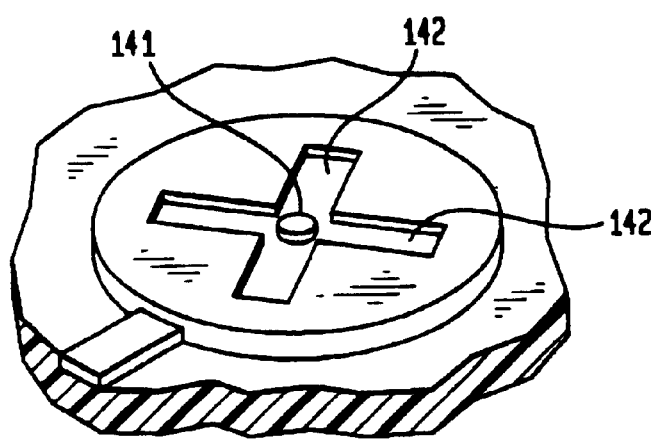

The pad depicted in FIG. 12 is similar to the pad shown in FIG. 11 except that the pad of FIG. 12 includes a non-wettable spot, 141 overlying the center point of the pad, between the inner ends of wettable line segments of 142.

Figure 13:
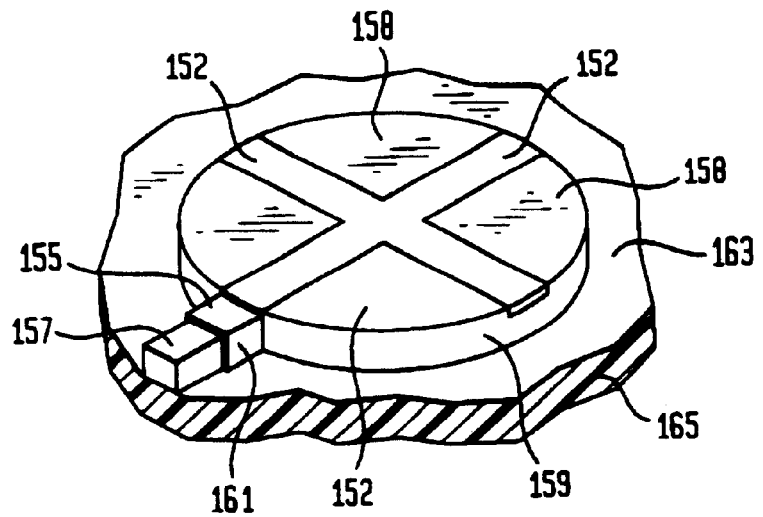

In a pad according to yet another embodiment shown in FIG. 13, the non-wettable elements on the exposed pad surface includes segments 158, so that wettable lines 152 extend between the segments. However, there is non ring-like non-wettable region around the periphery of the pad. Therefore, some of the lines 152 of wettable surface extend all the way to the periphery of the pad. A further non-wettable region 155 is provided along a trace 157 extending from the pad to block the flow of solder along the surface of the trace. The non-wettable regions may extend over the edges of the pad, so as to include non-wettable surfaces 159 along the pad edges and corresponding non-wettable surfaces 161 on the edges of trace 155. In operation, the non-wettable surface 163 of the polymeric base layer 165 helps to confine the solder and prevents it from flowing off the edges of the pad at the outer ends of the wettable lines 152. In the embodiments discussed above with reference to FIGS. 1–13, the wettable strips or line segments have substantially parallel edges, so that the line segments are substantially constant in a radial direction away from the center of the pad. However, this can be varied so that the strips increase or decrease somewhat in width in the radial direction. Also, although the strips desirably are spaced at equal intervals so that the angle defined between any two adjacent strips is equal to the angle defined between any other two adjacent strips on the same pad, this is not essential.

As numerous variations and combinations of the features discussed above can be utilized without departing from the present invention, the foregoing description of the preferred embodiment should be taken by way of illustration rather than by way of limitation of the invention as defined by the claims.

What is claimed is:

1. A microelectronic assembly comprising:
   a component including one or more conductive pads, each said conductive pad including a plurality of solder-wettable strips extending outwardly away from a center, said solder wettable strips being bounded by non solder-wettable material;
   a composite conductive element positioned atop at least one of said conductive pads, said composite conductive element including a solid conductive core and a layer of solder material overlying said solid conductive core, said solid conductive core having a higher melting temperature than said layer of solder material.

2. The assembly as claimed in claim 1, wherein said layer of solder material is in a molten state and said solid conductive core is in a solid state, and wherein said layer of solder material in the molten state contacts said solid conductive core and said solder-wettable strips.

3. The assembly as claimed in claim 2, wherein said layer of solder material is transformable from the molten state into a solid state, and wherein said composite conductive element is electrically interconnected with said at least one of said conductive pads.

4. The assembly as claimed in claim 1, wherein said component includes a base with said one or more conductive pads on said base, said base including a top dielectric layer and a compliant layer beneath said top dielectric layer.

5. The assembly as claimed in claim 1, wherein said at least one solid conductive core is substantially spherical.

6. The assembly as claimed in claim 1, wherein said at least one solid conductive core has a radius, and wherein the solder-wettable strips of said at least one pad project inwardly to a distance from the center of the pad that is less than the radius of the solid conductive core associated with said pad.

7. The assembly as claimed in claim 1, wherein said at least one pad includes at least three of said solder-wettable strips.

8. The assembly as claimed in claim 1, wherein said base includes a non solder-wettable dielectric material at a surface thereof that bounds said strips.

9. The assembly as claimed in claim 8, wherein said strips of said at least one pad overly said dielectric material.

10. The assembly as claimed in claim 1, wherein said at least one pad includes a metallic element having solder wettable surface regions defining the strips of the pad and non solder-wettable regions bounding said strips.

11. The assembly as claimed in claim 10, wherein said non solder-wettable regions of said at least one pad confine said layer of solder material in a molten state to said pad.

12. The assembly as claimed in claim 10, wherein said at least one pad has solder-wettable conductive traces extending therefrom along an exposed surface of the base and the non-wettable regions of said at least one pad includes non-wettable regions adjacent the intersections of said conductive traces, and wherein said non-wettable regions are adapted to block the spread of said molten layer of solder material along said traces.

13. The assembly as claimed in claim 1, wherein said component is heatable for transforming said layer of solder material from a solid state to a molten state.

14. The assembly as claimed in claim 1, wherein said solid conductive core is in contact with said conductive pad.

15. The assembly as claimed in claim 1, wherein said layer of solder material and said solid conductive core form a bump projecting from said conductive pad.

16. The assembly as claimed in claim 15, wherein said bump is insertable into a socket of a socket element.

17. The assembly as claimed in claim 1, further comprising a substrate juxtaposed with said component, said substrate having at least one pad thereon in engagement with said layer of a solder material, said layer of solder material and said solid core forming an electrical connection between said at least one pad of said component and said at least one pad on said substrate.

18. The assembly as claimed in claim 17, wherein said conductive pads on said substrate have solder thereon prior to being juxtaposed with said component.

19. The assembly as claimed in claim 4, wherein said top dielectric layer comprises a flexible polymeric sheet.

20. The assembly as claimed in claim 4, wherein the non solder-wettable material includes a dielectric solder mask layer overlying the top dielectric layer and outer ends of said solder-wettable strips.

21. A microelectronic assembly comprising:
   a component including one or more conductive pads on said component, each said conductive pad including a plurality of solder wettable strips extending outwardly away from a center; and
   a composite conductive element atop at least one of said conductive pads, said composite conductive element including a solid conductive core and a layer of solder material overlying said solid conductive core, said solid conductive core having a higher melting temperature than said layer of solder material.

22. The assembly as claimed in claim 21, wherein the layer of solder material of said composite conductive element is heatable into a molten state for wetting to said solder wettable strips and said solid core is in a solid state.

23. The assembly as claimed in claim 22, wherein said layer of solder material is transformable from the molten state to a solid state.

24. The assembly as claimed in claim 20, wherein said composite conductive element is electrically interconnected with said conductive pad.

25. The assembly as claimed in claim 21, wherein said base includes a top dielectric layer and a compliant layer beneath said top dielectric layer, and wherein each said pad has a surface with a solder-wettable area and a non-solder wettable area at the periphery of the wettable area.

26. The assembly as claimed in claim 21, wherein at least some of said pads have solder-wettable conductive traces extending therefrom along an exposed surface of the base and the non-wettable regions of at least some of said pads include non-wettable regions adjacent the intersections of said pads and traces, and wherein said non-wettable regions are adapted for blocking spread of the solder along said traces when said layer of solder material is in a molten state.

27. A microelectronic assembly comprising:

a component including a base and one or more pads on said base, each said pad including a plurality of solder-wettable strips extending outwardly away from a center, said solder-wettable strips being bounded by non-solder-wettable material;

providing composite conductive elements atop said one or more conductive pads, each said composite conductive element including a solid conductive core and a layer of solder material overlying said solid conductive core, said solid conductive core having a higher melting temperature than said layer of solder material, wherein said composite conductive elements are heatable to a temperature whereby the layers of solder material are in a molten state for wetting to said conductive pads while said solid cores remains in a solid state.

28. The assembly as claimed in claim 27, wherein said layers of solder material in the molten state are transformable to a solid state, and wherein said composite conductive elements are electrically interconnected with said conductive pads.

29. The assembly as claimed in claim 28, wherein said base includes a flexible polymeric sheet and a compliant layer beneath said flexible polymeric sheet.

30. The assembly as claimed in claim 29, wherein said non-solder-wettable material includes a dielectric solder mask layer over said flexible polymeric sheet, and wherein said solder mask layer has a hole at each said pad.

31. The assembly as claimed in claim 30, wherein the holes in said dielectric solder mask layer are substantially circular and substantially concentric with the centers of said pads.

32. The assembly as claimed in claim 30, wherein the holes in said dielectric solder mask layer are sized so that the outer ends of said solder-wettable strips are beneath said dielectric solder mask layer.

* * * * *